US006909445B2

(12) United States Patent
Baleras et al.

(10) Patent No.: US 6,909,445 B2
(45) Date of Patent: Jun. 21, 2005

(54) HIGH DENSITY ELEMENT STRUCTURE FORMED BY ASSEMBLY OF LAYERS AND METHOD FOR MAKING SAME

(75) Inventors: François Baleras, Seyssinet (FR); Gilles Poupon, Seyssinet-Pariset (FR); Bernard Aspar, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 299 days.

(21) Appl. No.: 10/240,751

(22) PCT Filed: Apr. 11, 2001

(86) PCT No.: PCT/FR01/01116

§ 371 (c)(1),
(2), (4) Date: Oct. 10, 2002

(87) PCT Pub. No.: WO01/76879

PCT Pub. Date: Oct. 18, 2001

(65) Prior Publication Data

US 2003/0052945 A1 Mar. 20, 2003

(30) Foreign Application Priority Data

Apr. 11, 2000 (FR) .......................................... 00 04617

(51) Int. Cl.[7] .................................................. B41J 2/34
(52) U.S. Cl. ...................................................... 347/200
(58) Field of Search .......................... 347/200, 201–208

(56) References Cited

U.S. PATENT DOCUMENTS

| 4,590,492 A | 5/1986 | Meier |
| 4,651,168 A | 3/1987 | Terajima et al. |
| 5,300,788 A | 4/1994 | McClelland et al. |
| 5,402,436 A | 3/1995 | Paoli |
| 5,485,193 A | 1/1996 | Inoue et al. |
| 5,624,708 A | 4/1997 | Sedberry |

FOREIGN PATENT DOCUMENTS

| EP | 0 335 473 | 10/1989 |
| EP | 0 493 055 | 7/1992 |
| JP | 60 054866 | 3/1985 |
| JP | 63 290767 | 11/1988 |

OTHER PUBLICATIONS

W.P. Maszara et al.: "Bonding of silicon wafers for silicon-on-insulator" J. Appl. Phys., vol. 64, No. 10, pp. 4943–4950 Nov. 15, 1988.

*Primary Examiner*—K. Feggins
(74) *Attorney, Agent, or Firm*—Oblon, Spivak, McClelland, Maier & Neustadt, P.C.

(57) ABSTRACT

A structure including a sequence of elements for sending or receiving a signal along an axis. Two successive elements along the direction of the axis are offset with respect to each other along the direction perpendicular to the axis. The structure includes at least two layers of material deposited on a reception substrate using the layer transfer technique. The structure particularly relates to any type of structure for which elements must have a high density, such as a print bead, networks of optical components, antenna networks, etc.

13 Claims, 7 Drawing Sheets

HIGH DENSITY ELEMENT STRUCTURE FORMED BY ASSEMBLY OF LAYERS AND METHOD FOR MAKING SAME

TECHNICAL FIELD AND PRIOR ART

This invention relates to a structure comprising a sequence of elements for sending or receiving a signal along an axis.

The invention may advantageously be used in the case in which the elements that will send or receive the signal must have a high density. For example, it may be applicable to networks of optical components (laser diodes, optical fibres, detectors), antenna networks, print heads, etc.

By way of a non-restrictive example, the invention will be described specifically for a print head application.

One known print technique is printing using arrays. Each array comprises elements aligned with each other side by side. Each element is either a magnetic head or a resistance, depending on whether the print signal is magnetostatic or thermal. One or several arrays placed end to end form a line with the same width as the support to be printed.

The support on which the printing will be done moves with respect to the arrays that transform the received electrical write signals into either magnetic signals or thermal signals. The support is printed line by line by relative movement of the support or the arrays. Each element receives a write signal that is repeated for each line to be printed.

Several processes for manufacturing print heads are known according to prior art.

A first known technique consists of assembling individual print heads. For example, an individual print head may comprise a magnetic head controlled by a diode or a transistor. The magnetic head is made on a mechanical support and the control diode is welded on the support. Individual print heads are then mounted on a mechanical support with an insertion part between heads.

This manufacturing method limits the resolution of the print head to values between 150 and 300 dpi (dots per inch).

Figure 1:
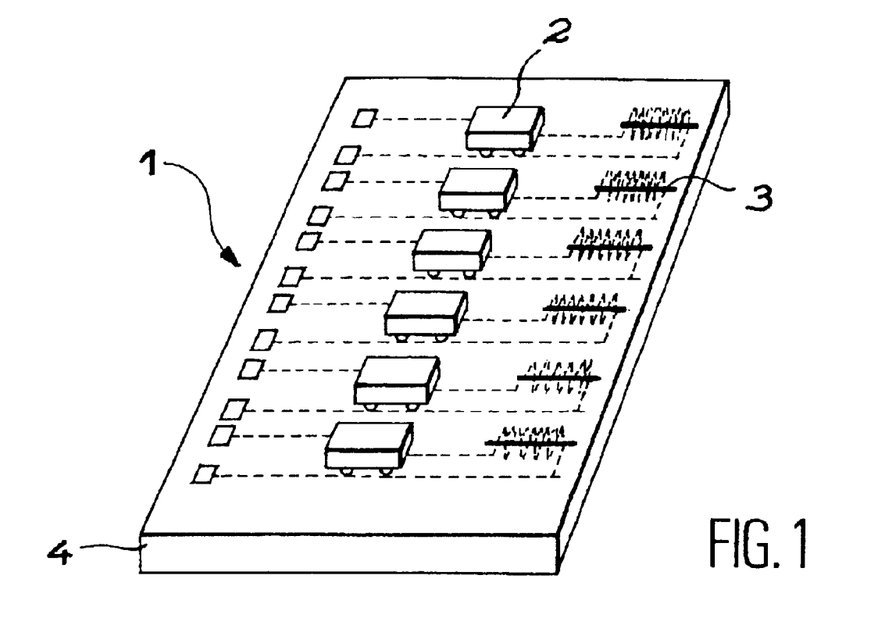
FIG. 1 shows a print head according to prior art.

A second manufacturing method is related to microelectronics techniques. The print heads are then made collectively on a semiconducting substrate. One example of the collective structure of print heads obtained according to this second method is shown in FIG. 1.

The print head 1 is composed of a set of individual magnetic heads 3 made on a semiconducting substrate 4. Each individual magnetic head 3 is controlled by a diode 2. The diodes 2 may be integrated or added onto the semiconducting substrate 4.

Resolutions of the order of 600 dpi can be achieved using this second manufacturing technique. However, such resolutions cannot be reached unless the size of the magnetic heads is reduced. Unfortunately, this results in a reduction in the intensity of the magnetic field induced by the magnetic heads.

This technique also has other disadvantages.

Figure 2:
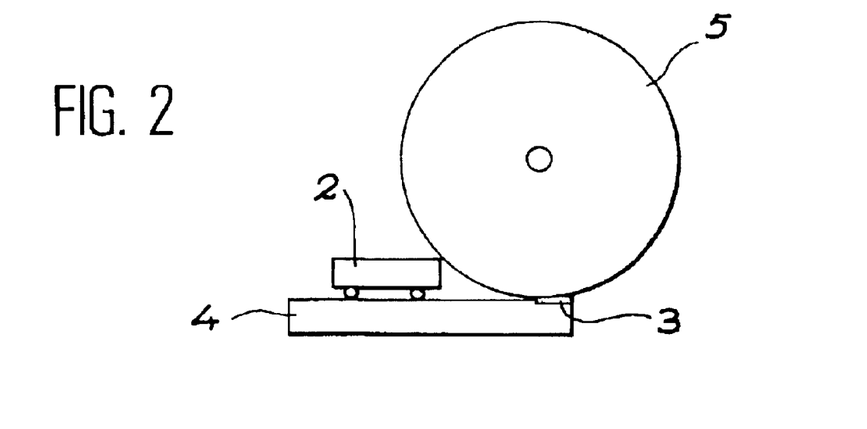
FIG. 2 shows a sectional view of the print head in FIG. 1, equipped with its drum.

As shown in FIG. 2, the drum 5 of the printer comes into contact with magnetic heads 3. If the diodes 2 are added onto the substrate 4, then the diodes 2 need to be moved away from the heads 3 to prevent the drum from coming into contact with the diodes. The zone between the diodes 2 and the heads 3 is then lost. The electrical resistance of the length of the line separating one diode 2 from a magnetic head 3 can then reduce the performances of the magnetic head.

If the diodes 2 are integrated into substrate 4, the disadvantage mentioned above no longer exists. However, in this case two different manufacturing technologies have to be implemented; one for the diodes and another for the magnetic heads. Consequently, the manufacturing efficiency is reduced.

The invention does not have the disadvantages mentioned above.

PRESENTATION OF THE INVENTION

The invention relates to a structure comprising a sequence of elements to send or receive a signal along an axis. At least two successive elements along the direction of the axis are offset from each other, in a direction perpendicular to the axis.

According to the preferred embodiment of the invention, the structure comprises at least one set of at least two layers of material deposited on a reception substrate, each layer of material comprising a sequence of elements in line with each other along a direction parallel to the axis, two successive elements of the structure along the direction parallel to the axis belonging to different layers.

The invention also relates to a print head comprising a sequence of magnetic heads or resistances to print along an axis. The print head is a structure like that according to the invention.

The invention also relates to a process for manufacturing a structure comprising a sequence of elements to send or receive a signal along an axis. The process comprises an assembly step of at least two material layers each comprising a sequence of elements aligned along a direction parallel to the axis, the assembly being made such that two successive elements of the structure along the direction parallel to the axis belong to two different layers.

According to the preferred embodiment of the invention, the material layers are assembled by transferring layers from a transfer support to a reception substrate and by putting the transferred layers into bonding contact.

The invention also relates to a process for manufacturing a print head comprising a series of magnetic heads or resistances to make a printout along an axis. The process implements a process according to the invention as described above.

The invention also relates to a process for manufacturing a structure comprising a sequence of elements to send or receive a signal along an axis, two successive elements along the direction of the axis being offset, one with respect to the other, along a direction perpendicular to the axis, characterised in that it comprises the following steps:

deposition of at least one semiconducting layer on a first semiconducting substrate, comprising a set of elements aligned with each other to send or receive a signal along the axis, transfer from a transfer support onto a free face of a semiconducting layer deposited on the first substrate, withdrawal of the first substrate, transfer using the transfer support, from the free face of the semiconducting layer that appeared after the first substrate was withdrawn on a first free face of a semiconducting layer fixed on a reception substrate and comprising a set of elements aligned with each other to send or receive a signal along the axis, molecular bonding on the two faces brought into contact by transferring, using the transfer support.

Advantageously, the invention provides a high resolution structure. For example, it is possible to achieve resolutions of the order of 1200 dpi or more, by successive layer transfers.

The process according to the preferred embodiment of the invention uses the layer (or multiple layer) transfer technique by molecular bonding on wafer scale. This technique consists of making at least one semiconducting layer on a first substrate comprising print heads, and then transferring the semiconducting layer(s) comprising the print heads by molecular bonding, onto a second substrate on which there is already at least one layer comprising print heads; thus, the number of levels of print heads of the structure can then be increased successively. Molecular bonding enables the manufacture of interconnections using microelectronics techniques (plasma etching, sputtering). Depending on the structures made, it is possible to bring all input/outputs onto a single face or onto two faces. Furthermore, the layer transfer technique is compatible with the mixing process for meltable beads.

This technique is also compatible with wafer thinning methods, which can further reduce the dimensions of the print module.

The distance between two consecutive heads may be reduced to the thickness of the layers, so that a vertical pitch equivalent to the horizontal pitch can be obtained.

This method also enables the assembly of several functions (layers for heads and layers for control circuits) and interconnections between the heads and control circuits (still using microelectronics processes).

When transferring onto a back face, the advantage of transfer by molecular bonding means that print heads can be made on both sides such that the layers on each face do not come into contact with the equipment substrate holders.

Compared with assembly techniques according to prior art, the assembly technique by transfer of layers according to the preferred embodiment of the invention advantageously initially makes it possible to make a stack of heads on a first support so that the precision of microelectronics technologies can be used, and then to transfer the stack of heads onto another support adapted to the required application. For example, the first support may be a wafer made of silicon, AsGa, SiC, SOI or InP. For example, the support adapted to the required application may be a plastic substrate for a print head application with a drum system (which then avoids deterioration of the substrate due to friction of the substrate on the drum), a ceramic substrate for a head using a thermal effect, a printed circuit to connect a stack of heads to other components such as control chips, or a flexible printed circuit.

The assembly technique according to the invention thus makes it possible to integrate all functions (print heads, control circuits and interconnections) on one or two supports depending on the variant, while minimizing the dimensions of the module (global dimensions and distance between heads).

In the remainder of the description, the invention will be described specifically for the case in which the structure is a print head and the elements are magnetic heads. More generally, as already mentioned above, the invention relates to any structure comprising a sequence of elements to send or receive a signal along an axis: network of optical components (laser diodes, optical fibres, detectors), antenna networks, etc.

BRIEF DESCRIPTION OF THE FIGURES

Other characteristics and advantages of the invention will become clear after reading embodiments of the invention made with reference to the appended figures among which.

DETAILED DESCRIPTION OF EMBODIMENTS OF THE INVENTION

The same marks denote the same elements in all figures.

FIGS. 1 and 2 have already been described, and therefore there is no point in describing them again.

Figure 3:
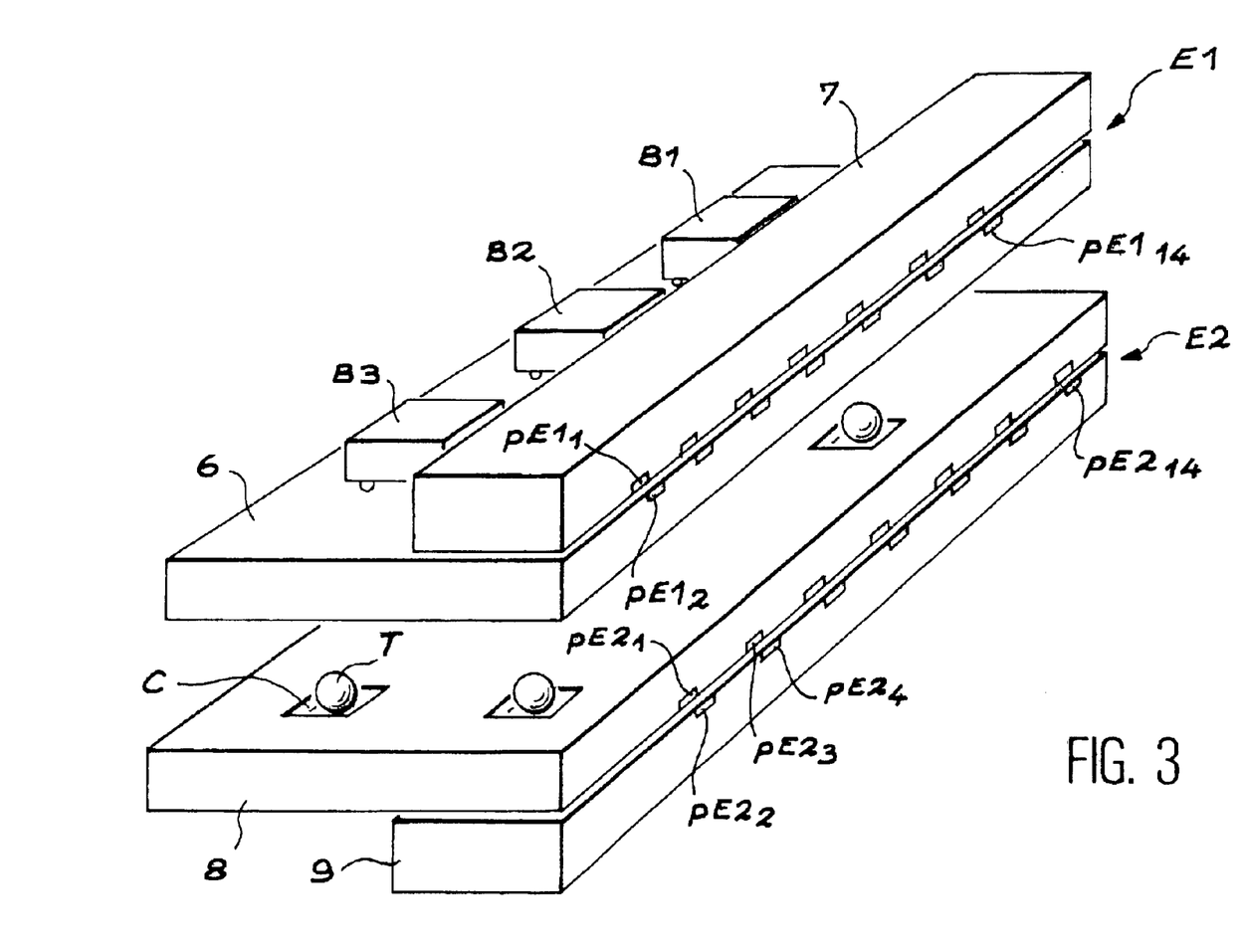
FIG. 3 shows a perspective view of a first embodiment of a print head according to the invention.

FIG. 3 shows a perspective view of two subassemblies used to make a first example of a print head according to the invention.

A first subassembly E1 comprises a first array 6, a second array 7 and several blocks of diodes B1, B2 and B3. A second subassembly E2, identical to the first subassembly E1, comprises a first array 8, a second array 9 and several blocks of diodes (not shown in the figure).

Arrays 6 and 7 of subassembly E1, and arrays 8 and 9 of subassembly E2, are fixed to each other, for example by solder beads deposited on anchor studs. These solder beads also make an electrical connection between the arrays 6 and 7 of subassembly E1 and arrays 8 and 9 of subassembly E2.

Each array comprises a set of magnetic heads made on one of its faces. The face on which the magnetic heads of array 6 are located is fixed to the face on which the magnetic heads of array 7 are located. Similarly, the face on which the magnetic heads of array 8 are located is fixed to the face on which the magnetic heads of array 9 are located.

In order to fix the array 7 (or 9) to array 6 (or 8), the array 7 (or 9) is located on the array 6 (or 8), and the parts align themselves with each other during the solder bead remelting phase.

The control diodes of the magnetic heads in the first subassembly E1 are made in blocks (B1, B2, B3) added onto the face of the array 6 on which the magnetic heads are made. The diodes of blocks B1, B2, B3 are used to control the magnetic heads of array 6 and the magnetic heads of array 7 at the same time.

Similarly, the control diodes for the magnetic heads in the second subassembly E2 are made in blocks (not shown in the figure) added onto the face of the array 8 on which the magnetic heads are made.

The diodes in the blocks thus added on are used to control the magnetic heads of arrays 8 and 9.

The two subassemblies E1 and E2 are assembled to each other using spacers T, for example rigid beads, placed in cavities C previously formed on the back faces of the corresponding arrays 6 and 8.

The two subassemblies E1 and E2 are pressed into contact with each other and aligned. The remaining space between the modules can then be filled in with glue, for example epoxy resin.

The subassemblies E1 and E2 may also be assembled by meltable beads added onto anchor studs. These anchor studs are then firstly made on the back faces of the corresponding arrays 6 and 8.

The remelting temperature of the beads used to assemble subassemblies E1 and E2 is less than the remelting temperature of the beads used for assembly of arrays 6 and 7 (or 8 and 9). The two subassemblies become aligned with each other during the melting phase.

Regardless of the stack made, the assembly at the end of the process may advantageously be filled, for example, with resin to give a mechanically rigid assembly (similarly for other example embodiments).

The ends of the magnetic heads of subassemblies E1 and E2 form magnetic poles. By way of a non-restrictive example, the subassembly E1 comprises 14 magnetic poles $PE1_1, \ldots, PE1_{14}$ and subassembly E2 comprises 14 magnetic poles $PE2_1, \ldots, PE2_{14}$. According to the invention, the signals that form a print line on the support are then composed, for example, of signals output from a sequence of magnetic poles $PE1_1, PE2_1, PE1_2, PE2_2, \ldots, PE1_{14}, PE2_{14}$.

The difference in height between poles in the direction perpendicular to the axis that defines the print line may be compensated by an electronic time shift system.

By way of a non-restrictive example, for a pitch of magnetic poles that gives a resolution of 225 dpi for an array (6, 7, 8 or 9), a resolution of 450 dpi can be obtained for each subassembly E1, E2 by assembling the corresponding arrays of these subassemblies with an offset of a half-pitch. An assembly of two sub-assemblies E1 and E2 with a quarter-pitch offset then gives a resolution 900 dpi. This resolution can then be further increased if the pitch of the magnetic poles in an array gives a resolution better than 225 dpi. For example, a resolution of 300 dpi for arrays 6, 7, 8 and 9 gives a resolution of 1200 dpi (4×300 dpi) for the print head composed of the two subassemblies E1 and E2.

An offset in the magnetic poles along a direction parallel to the print axis may be made in several ways. For example it is possible either to make different arrays with different positions of the magnetic poles and then assemble the arrays symmetrically, or to make identical arrays and then assemble the arrays offset from each other.

Figure 4A:
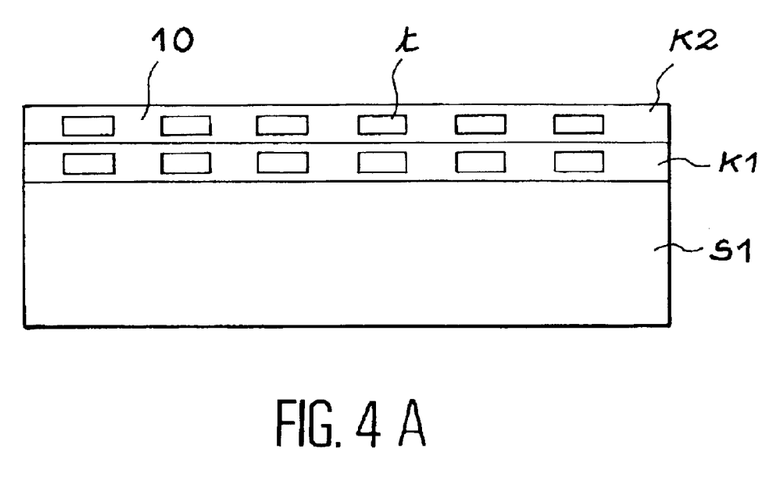
FIG. 4A shows a longitudinal sectional view of a print head and FIG. 4B shows a transverse view of a substrate comprising print heads according to the invention.
Figure 4B:
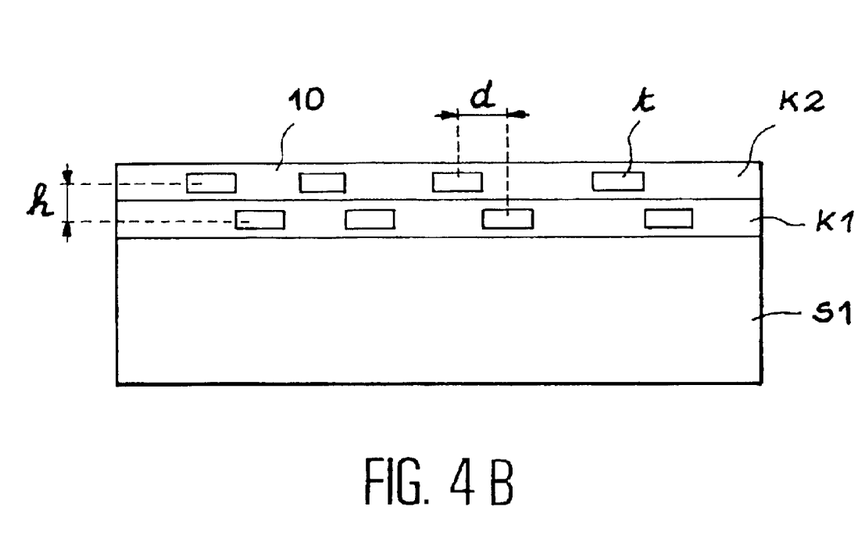

FIGS. 4A and 4B show a longitudinal sectional view of a print head and a transverse sectional view of a substrate comprising print heads according to the invention, respectively.

Substrate S1 is covered by a layer K1 that is itself covered by a layer K2. Each layer Ki (i=1, 2) is composed of a material 10 in which the magnetic heads t are formed. An increase in the resolution is obtained by an offset of the magnetic heads t (see FIG. 4B). Advantageously, the distance h that separates two successive magnetic heads along the direction perpendicular to the print axis may be as high as of the order of 20 $\mu$m to 30 $\mu$m. This value of h may be approximately equal to the minimum distance d between two successive magnetic heads in the print head. In this case, no electronic compensation of signals applied to magnetic heads is necessary.

The print head described in FIGS. 4A and 4B only contains two layers K1 and K2 equipped with magnetic heads. However, note that more generally, the invention relates to a print head comprising at least two layers equipped with magnetic heads.

FIGS. 5A to 5F show an example of a process for manufacturing a print head according to the invention.

Figure 5A:
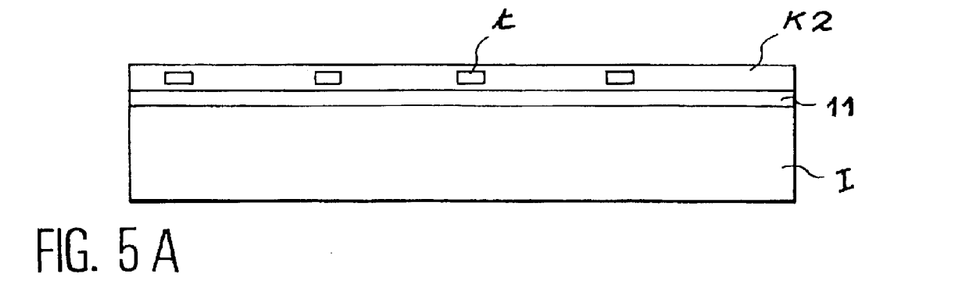
FIGS. 5A to 5F show a process for manufacturing a print head according to the second embodiment shown in FIGS. 4A and 4B, FIGS. 6A to 6F show different examples of print heads according to the invention.
Figure 5B:
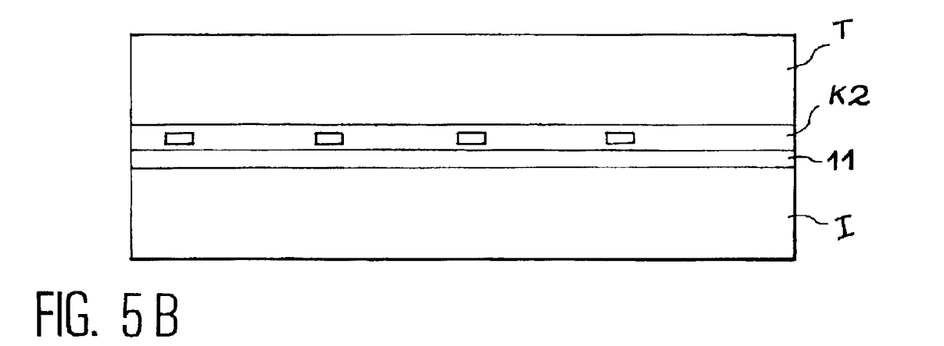
Figure 5C:
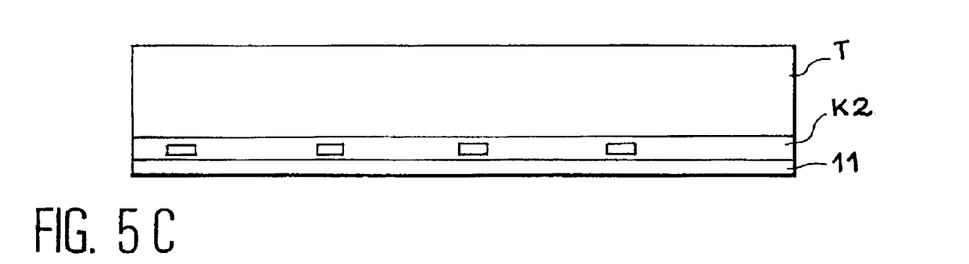
Figure 5D:
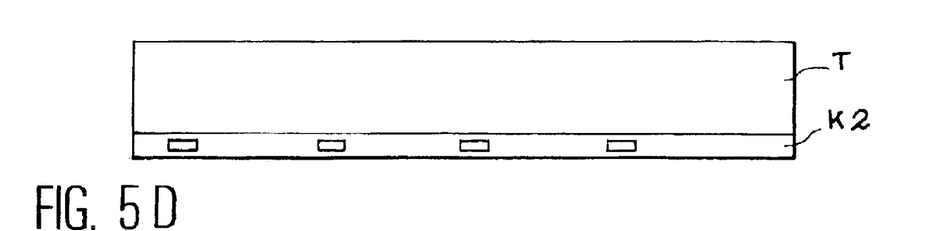
Figure 5E:
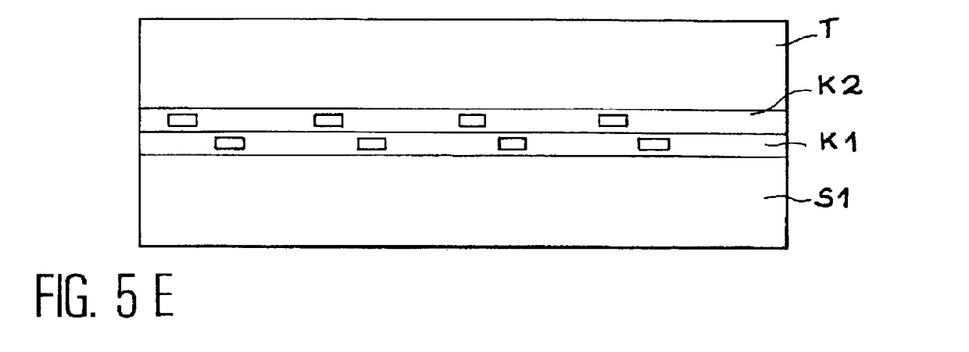

FIG. 5A shows a structure composed of an initial substrate I on which a stop layer 11 and a layer K2 equipped with magnetic heads t, are deposited. The substrate I enables the formation of layers 11 and K2 according to microelectronics technologies. The substrate I may for example be a wafer of silicon, AsGa, SiC, SOI or InP. The stop layer 11 may for example be a silicon oxide.

By way of a non-restrictive example, the structure shown in FIG. 5A comprises a stop layer 11 and a layer K2 equipped with magnetic heads t. The invention also relates to the case in which there is no stop layer 11 and/or the case in which the structure comprises a stack of several layers equipped with magnetic heads.

Figure 5F:
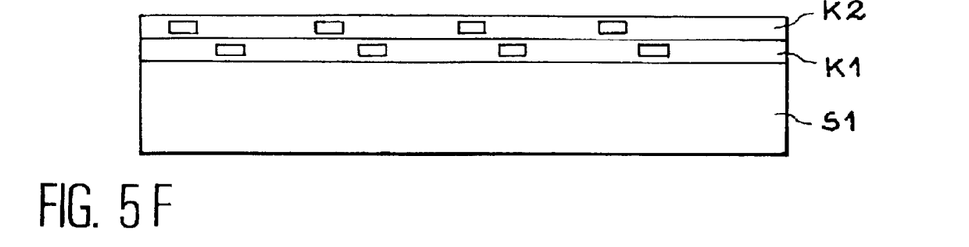

The process for manufacturing of a print head starting from a structure such as that shown in FIG. 5A comprises the following steps:

transfer of a transfer support t onto the free face of the layer K2, for example by bonding. The transfer support T, commonly called a handle, may be made from a transparent material, for example glass or pure silica, to avoid alignment problems (FIG. 5B), withdrawal of the initial substrate I by a conventional process or a combination of conventional processes such as mechanical grinding, polishing, separation along a cleavage plan induced by ionic implantation, chemical etching, reactive, selective etching or ultra-sound etching (FIG. 5C), removal of the stop layer 11 (FIG. 5D), transfer of the free face of layer K2 onto the free face of a layer K1, the other face of which is fixed to a substrate S1, and the two faces being brought into bonding contact for example by gluing or molecular bonding; the gluing energy may be increased by carrying out surface treatments on the surfaces to be glued, removal of the transfer support T by one of the processes mentioned above in the description of FIG. 5C (FIG. 5F).

The process according to the invention also comprises steps in which electrical contact is made on the magnetic heads (opening in the passivation and metallisation layers) These steps are not shown in the figures.

By way of a non-restrictive example, layers K1 and K2 may be made starting from the semiconducting material. The layer K1 can then be transferred onto layer K2 using the molecular bonding technique. Molecular bonding concerns two bonding types; hydrophilic bonding and hydrophobic bonding. Hydrophilic bonding is the result of a change to —OH interactions at the surface of the structure, for example to form Si—O—Si bonds. The forces associated with this type of interaction are strong. The bonding energy, of the order of 100 mJ/m$^2$ at ambient temperature, can be as high as 500 mJ/m$^2$ after annealing at 400° C. for 30 minutes (values obtained by native or hydrophilic SiO2—thermal unpolished SiO2 bonding).

The bonding energy is usually determined using the strip method divulged by W. P. MASZARA et al. in the "Bonding of silicon wafers for silicon-on-insulator" article published in J. Appl. Phy. 64(10), Nov. 15, 1988, pages 4943–4950. The bonding energy for bonding between a deposited and polished silicon oxide and a deposited and polished silicon oxide is of the order of 1 J/m$^2$ for annealing under the same conditions. However, if a hydrophilic treated surface is bonded onto a hydrophobic treated surface by molecular bonding, the bonding quality obtained is very poor and the bonding forces are very low:bonding energy of the order of 100 mJ/m$^2$ after annealing at 400° C. for 30 minutes.

With this bonding method, two substrates comprising microelectronics technologies can be bonded provided that their surface conditions are prepared. The precision on the pitch of two successive magnetic heads is advantageously obtained by the bonding precision, namely ±approximately 1 μm both along the direction of the print axis and along the direction perpendicular to the print axis.

FIGS. 6A to 6F show different examples of print heads according to the invention.

Figure 6A:
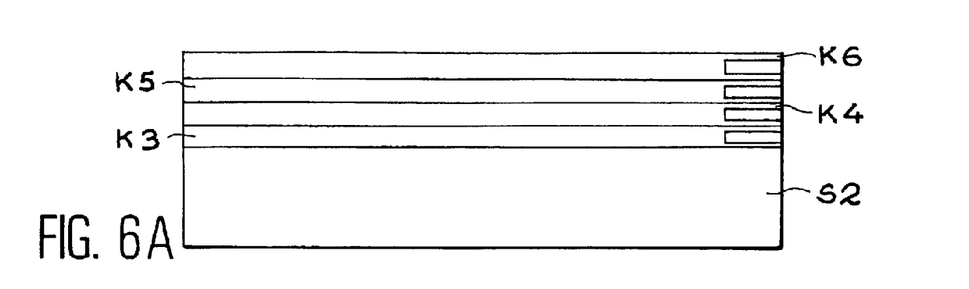
Figure 6B:
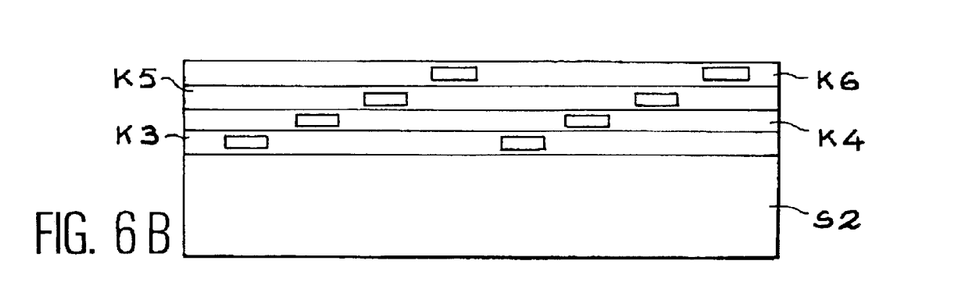

FIGS. 6A and 6B show a longitudinal view and a transverse view respectively of a structure composed of a substrate S2 on which four layers K3, K4, K5 and K6 are stacked in sequence.

Figure 6C:
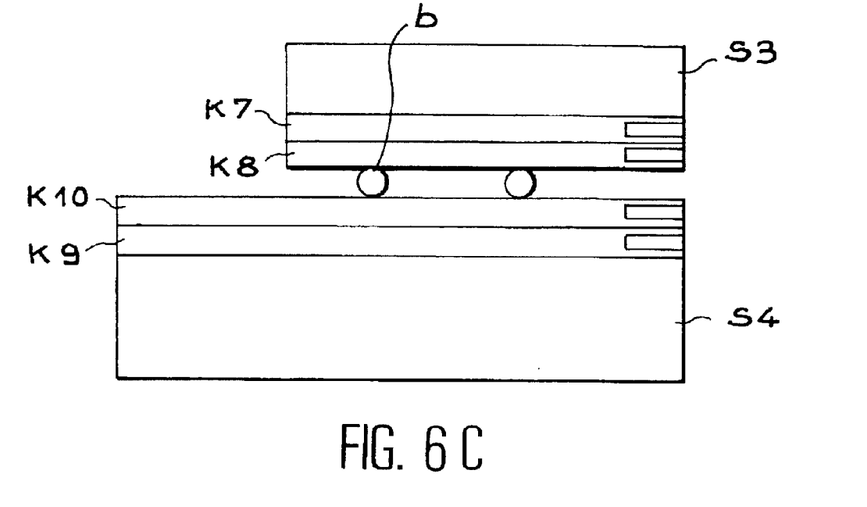
Figure 6D:
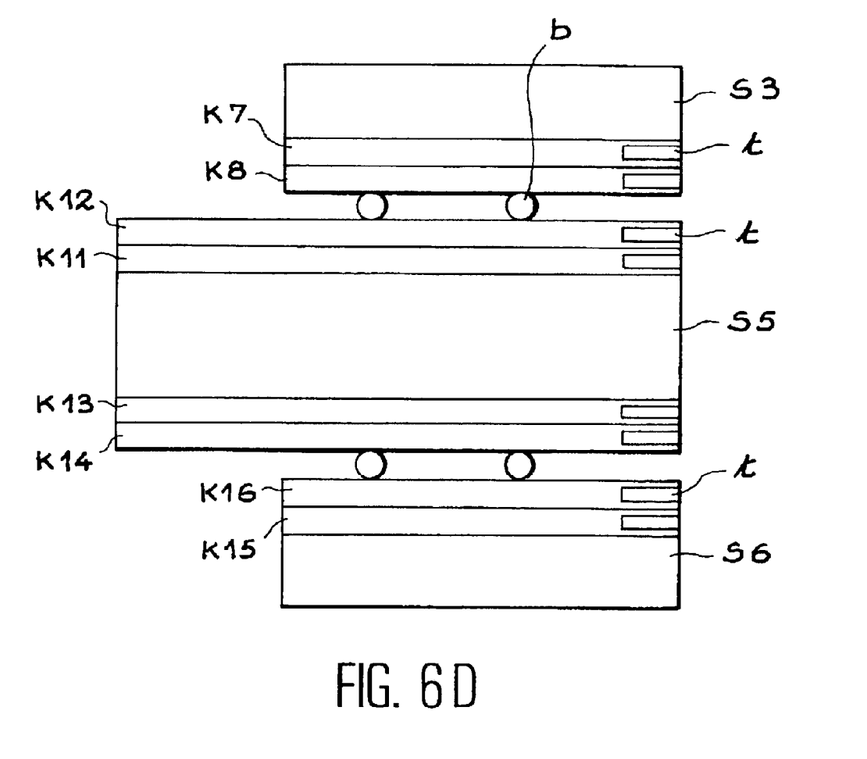

FIGS. 6C and 6D show two examples of print heads comprising structures assembled using connections by solder beads. Those skilled in the art know how to make connections by solder beads referred to as the "flip-chip" technique.

FIG. 6C shows an assembly of two structures. The first structure is composed of a substrate S3 on which two layers K7 and K8 are bonded in sequence. A second structure is composed of a substrate S4 on which two successive layers K9 and K10 are bonded. The connection by solder beads is made between the free faces of layers K8 and K10. For example, this structure can give a resolution of the order of 1200 dpi.

The print head shown in FIG. 6D comprises the association of three structures. A first structure is composed of a substrate S5 covered on a first face by two layers K13 and K14, and on the other face by two layers K15 and K16. The other two structures are each composed of a substrate (S3, S6) on which two layers are bonded (K7 and K8 for substrate K3; K15 and K16 for substrate S6). The free faces of layers K16 and K14, and the free faces of layers K8 and K12, are assembled by solder beads.

Figure 6E:
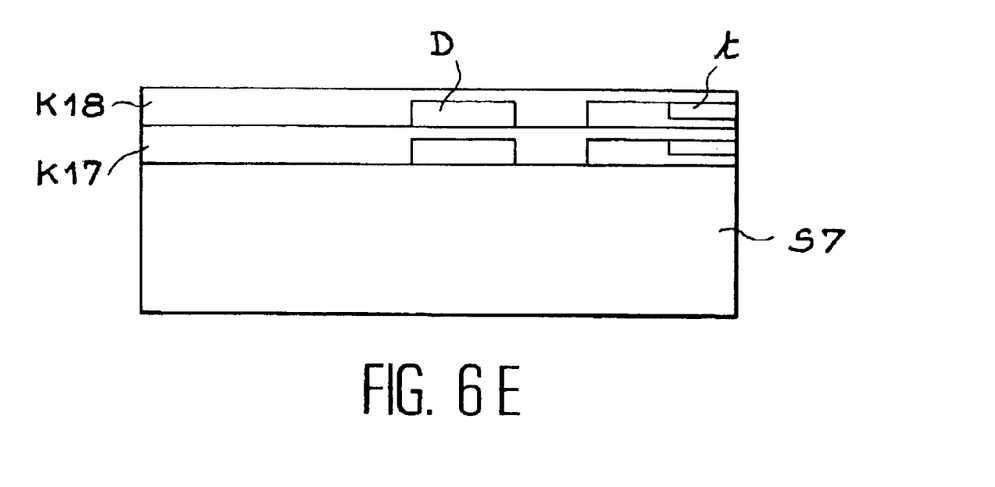
Figure 6F:
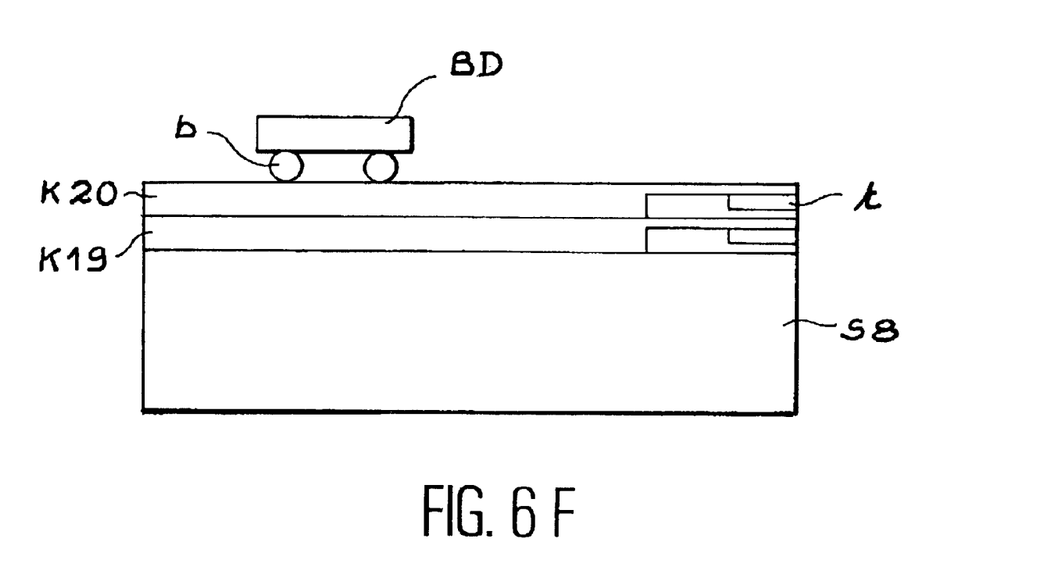

FIGS. 6C and 6F show two examples of print heads according to the invention including diodes for control of the magnetic heads.

FIG. 6E shows a structure with two layers K17 and K18, each layer comprising a set of diodes D for controlling the magnetic heads contained in it. FIG. 6F shows a structure with two layers K19, K20. A diodes block BD is connected by solder beads b to the free face of the upper layer K20.

FIGS. 6A–6F are given by way of non-restrictive examples. More generally, as already mentioned above, the invention relates to any structure comprising at least one assembly composed of a reception substrate on which at least two layers of material, each provided with magnetic heads, are deposited. The assemblies composed of a reception substrate and layers of material can then be connected to each other by solder beads or by any other means.

What is claimed is:

1. Structure comprising:
   a sequence of elements to send or receive a signal along an axis;
   two successive elements along a direction of the axis being offset from each other along a direction perpendicular to the axis;
   at least one set of at least two layers of semiconducting material deposited on a reception substrate, each layer of semiconducting material comprising a sequence of elements in line with each other along a direction parallel to the axis, two successive elements of the structure along the direction parallel to the axis belonging to two different layers, the layers of semiconducting material in at least one set of layers being brought into bonding contact by molecular bonding.

2. Structure according to claim 1, wherein a first assembly is connected to a second assembly by solder beads.

3. Structure according to claim 1, wherein at least one reception substrate is covered with at least two layers of material on a first face and with at least two layers of material on a second face.

4. Structure according to claim 1, further comprising at least one set of diodes in a form of a chip connected by solder beads onto a face of a layer of material.

5. Structure according to claim 1, further comprising at least one set of diodes in a form of diodes integrated into a layer of semiconducting material.

6. Print head comprising a sequence of magnetic heads or resistances to print along an axis, including a structure according to claim 1, in which an element of the sequence of elements is a magnetic head or a resistance.

7. Process for manufacturing a structure including a sequence of elements to send or receive a signal along an axis, the process comprising:
   assembling at least two layers of semiconducting material, each comprising a sequence of elements aligned along a direction parallel to the axis, the assembly being made such that two successive elements of a structure along a direction parallel to the axis belong to two different layers,
   the assembling comprising transferring a second layer of semiconducting material onto a first layer of semiconducting material to bring a first face of the first layer into bonding contact with a first face of the second layer, by molecular bonding.

8. Process according to claim 7, wherein the second layer of material is transferred onto the first layer of material by a transfer support fixed to the second layer.

9. Process according to claim 8, further comprising removing the transfer support, once the faces of the layers have been put into bonding contact.

10. Process according to claim 7, further comprising connecting using solder beads between a first assembly composed of a first reception substrate onto which at least two layers of material are fixed by bringing them into bonding contact, and at least one second assembly composed of a second reception substrate, on which at least two layers of semiconducting material are fixed by bringing them into bonding contact.

11. Process according to claim 7, further comprising connecting at least a set of diodes onto at least one layer of material by solder beads, each diode in the set of diodes enabling control of an element of the layer.

12. Process according to claim 7, further comprising forming at least a set of diodes in at least one layer of semiconducting material, each diode in the set of diodes enabling control of one element in the layer of semiconducting material.

13. Process for manufacturing a print head including a sequence of magnetic heads or resistances to make a printout along an axis, using a process according to claim 7, in which one element of the sequence of elements is a magnetic head or a resistance.

* * * * *